United States Patent
Inoue et al.

(10) Patent No.: US 11,508,885 B2
(45) Date of Patent: Nov. 22, 2022

(54) LIGHT EMITTING DEVICE

(71) Applicant: NICHIA CORPORATION, Anan (JP)

(72) Inventors: Hiroki Inoue, Anan (JP); Masafumi Kuramoto, Tokushima (JP)

(73) Assignee: NICHIA CORPORATION, Anan (JP)

( * ) Notice: Subject to any disclaimer, the term of this patent is extended or adjusted under 35 U.S.C. 154(b) by 542 days.

(21) Appl. No.: 16/586,526

(22) Filed: Sep. 27, 2019

(65) Prior Publication Data
US 2020/0105987 A1    Apr. 2, 2020

(30) Foreign Application Priority Data

Sep. 28, 2018 (JP) .............. JP2018-184045
Sep. 12, 2019 (JP) .............. JP2019-166348

(51) Int. Cl.
| C08L 83/04 | (2006.01) |
|---|---|
| H01L 33/56 | (2010.01) |
| H01L 33/62 | (2010.01) |
| H01L 33/48 | (2010.01) |
| C08G 77/20 | (2006.01) |
| C08K 5/00 | (2006.01) |
| H01L 33/50 | (2010.01) |
| F21K 9/64 | (2016.01) |
| C08K 5/56 | (2006.01) |
| H01L 33/60 | (2010.01) |
| C08G 77/12 | (2006.01) |
| F21K 9/00 | (2016.01) |

(52) U.S. Cl.
CPC ............. *H01L 33/56* (2013.01); *C08G 77/20* (2013.01); *C08K 5/0091* (2013.01); *C08K 5/56* (2013.01); *C08L 83/04* (2013.01); *F21K 9/64* (2016.08); *H01L 33/486* (2013.01); *H01L 33/507* (2013.01); *H01L 33/62* (2013.01); *C08G 77/12* (2013.01); *F21K 9/00* (2013.01); *H01L 33/60* (2013.01)

(58) Field of Classification Search
CPC ....... C08G 77/398; C08G 77/58; C08L 83/14; C08L 83/04; H01L 33/56
See application file for complete search history.

(56) References Cited

U.S. PATENT DOCUMENTS 8,907,038 B2    12/2014 Hara et al.
9,493,634 B2*   11/2016 Kleyer .............. C08L 83/04
2013/0090447 A1   4/2013 Hara et al.
2014/0288236 A1   9/2014 Depierro et al.
2014/0357770 A1  12/2014 Depierro et al.
2016/0168359 A1*  6/2016 Kleyer .............. C09K 11/0883
                                                      534/15
2017/0294419 A1* 10/2017 Nakabayashi ......... H01L 33/56

FOREIGN PATENT DOCUMENTS

| JP | 2001-234032 A | 8/2001 |
|---|---|---|
| JP | 2002-145993 A | 5/2002 |
| JP | 2002-302533 A | 10/2002 |
| JP | 4788837 B2 | 10/2011 |
| JP | 2015-502425 A | 1/2015 |
| JP | 2015-505329 A | 2/2015 |
| JP | 2015-209466 A | 11/2015 |
| JP | 2016-145273 A | 8/2016 |
| JP | 2016-172848 A | 9/2016 |

* cited by examiner

*Primary Examiner* — Margaret G Moore
(74) *Attorney, Agent, or Firm* — Birch, Stewart, Kolasch & Birch, LLP

(57) ABSTRACT

A light emitting device includes a light emitting element, a substrate which contains a conductive member containing silver having the light emitting element mounted, and a sealing member which covers the light emitting element, and the sealing member is made of a cured silicone composite containing the following components (A), (B), (C), and (D):

(A) an organopolysiloxane containing at least two alkenyl groups each bonded to a silicon atom per one molecule;
(B) an organohydrogenpolysiloxane containing at least two hydrogen atoms each bonded to a silicon atom per one molecule;
(C) a hydrosilylation catalyst; and
(D) a zinc silanolate represented by the following formula (1):

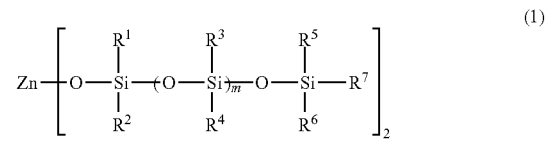

(1)

In the formula (1), $R^1$ to $R^7$ each independently represent a linear, branched, or cyclic monovalent hydrocarbon group having 1 to 10 carbon atoms, which may be substituted by a fluorine atom, or each independently represent a hydroxy group or an alkoxy group; and m represents an integer of 1 or greater.

19 Claims, 1 Drawing Sheet

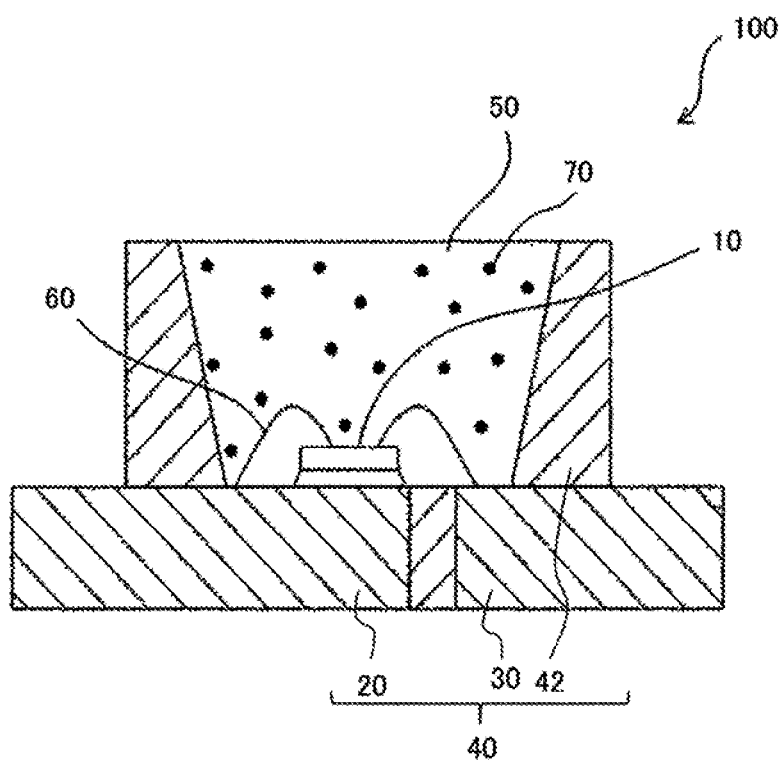

LIGHT EMITTING DEVICE

CROSS-REFERENCE TO RELATED PATENT APPLICATION

This application claims priority to Japanese Patent Application No. 2018-184045, filed on Sep. 28, 2018, and Japanese Patent Application No. 2019-166348, filed on Sep. 12, 2019, the entire disclosures of which are incorporated herein by references in their entirety.

BACKGROUND

Technical Field

The present invention relates to a light emitting device.

Description of Related Art

Light emitting devices using a light emitting element, such as a light emitting diode (which may be hereinafter referred to as "LED") or a laser diode (which may be hereinafter referred to as "LD"), have been used for various kinds of light sources. A light emitting device using a light emitting element, such as LED or LD, is a light source having a high conversion efficiency, has small electric power consumption and a long lifetime, and allows reduction in size, and thus is used for a light source in place of an incandescent lamp and a fluorescent lamp. In particular, a surface-mount light emitting device has such characteristics as small size, emission of light with a bright color, good initial driving characteristics, and durability against vibration and repeated turning-on and off. Increase in the output power of the light emitting element is also rapidly progressing. The light emitting device using LED or LD is used in various fields including a light emitting device of automobile use and indoor lighting, a backlight source for a liquid crystal display device, an illuminating device, a light source device for a projector.

In the light emitting device, a sealing member covering the light emitting element is used for protecting the light emitting element from moisture, dusts, and the like. For the sealing member, a composite containing an epoxy resin is used, as described, for example, in Japanese Unexamined Patent Publication No. 2001-234032, Japanese Unexamined Patent Publication No. 2002-145993 or Japanese Unexamined Patent Publication No. 2002-302533. Furthermore, a silicone resin is also used as the sealing member along with the increase of the output power of the light emitting element as described in Japanese Unexamined Patent Publication (Translation PCT Application) No. 2015-505329.

SUMMARY

However, the sealing member made of a composite containing an epoxy resin tends to discolor to yellow due to light and heat emitted from the light emitting element with an increased output power, which may cause change in the color of the light emitted from the light emitting device, so that the desired long lifetime may not be achieved. Furthermore, the sealing member a composite containing a silicone resin has high gas permeability and tends to transmit air, so that the silver plating used in the light emitting device discolors over time due to sulfides in air, which may result in reduction of the luminous flux of the light emitting device.

One object of certain embodiments of the present invention is to provide a light emitting device in which sulfurization resistance is improved and lumen maintenance is increased.

A light emitting device according to a first embodiment of the present disclosure includes a light emitting element configured to emit light having a peak wavelength of 320 nm or more, a substrate which includes a conductive member on which the light emitting element is mounted, and a sealing member which covers the light emitting element, in which the conductive member contains silver, and the sealing member made of a cured silicone composite containing the following components (A), (B), (C), and (D):

(A) an organopolysiloxane containing at least two alkenyl groups that are each bonded to a silicon atom per one molecule;

(B) an organohydrogenpolysiloxane containing at least two hydrogen atoms that are each bonded to a silicon atom per one molecule;

(C) a hydrosilylation catalyst; and (D) a zinc silanolate represented by the following formula (1):

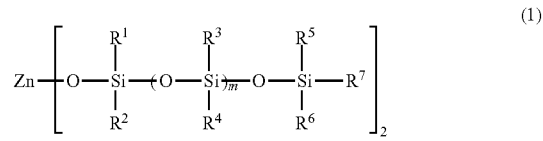

In the formula (1), $R^1$ to $R^7$ each independently represent a linear, branched, or cyclic monovalent hydrocarbon group having 1 to 10 carbon atoms, which may be substituted by a fluorine atom, or each independently represent a hydroxy group or an alkoxy group; and m represents an integer of 1 or greater.

According to one embodiment of the present disclosure, a light emitting device that is improved in sulfurization resistance and has a high lumen maintenance can be provided.

BRIEF DESCRIPTION OF THE DRAWING

FIG. 1 is a schematic cross-sectional view showing one example of a light emitting device.

DETAILED DESCRIPTION

The light emitting device according to the present invention will be described with reference to an embodiment below. The embodiment shown below includes examples for practicing the technical concept of the present invention, and the present invention is not limited to the light emitting devices shown below. The relationships between the color names and the chromaticity coordinates, the relationships between the wavelength range of light and the color names of monochromic light are in accordance with Japanese Industrial Standard (JIS) Z8110. When a plurality of substances corresponds to a component in a composite, an amount of the component in the composite refers to a total amount of the plurality of substances corresponding to the component in the composite, unless otherwise specified.

One example of a light emitting device according to one embodiment of the present invention will be described with reference to the drawings. FIG. 1 is a schematic cross-sectional view showing a light emitting device 100 according to one embodiment of the present invention.

Light Emitting Device

The light emitting device 100 includes a light emitting element 10 configured to emit light having a peak wavelength of 320 nm or more, a substrate 40 containing a plurality of conductive members 20 and 30, and a sealing member 50 covering the light emitting element 10. The sealing member 50 may contain a fluorescent material 70 that emits light when excited by light from the light emitting element 10.

Substrate

The substrate 40 includes a package member 42 defining a recess defined by lateral walls, and the plurality of conductive members 20 and 30 constituting a bottom portion of the recess of the package member 42, which are integrally molded with a resin composite. The light emitting element 10 is mounted on the conductive member 20 constituting the bottom surface of the package member 42. The light emitting element 10 is electrically connected to the plurality of conductive members 20 and 30 respectively with wires 60. The light emitting element 10 mounted on the conductive member 20 constituting the bottom surface of the package member 42 is sealed with the sealing member 50. A portion of each of the plurality of conductive members 20 and 30 is exposed outward of the substrate 40, and is configured to be supplied with electricity to allow light emission of the light emitting device 100.

For a resin contained in the resin composite constituting the package member 42 of the substrate 40, a thermosetting resin or a thermoplastic resin may be used. More specific examples of the resin used for the resin contained in the resin composite constituting the package member 42 include an epoxy resin, a modified epoxy resin, a silicone resin, a modified silicone resin, a polyimide resin, a modified polyimide resin, a urethane resin, a modified urethane resin, a bismaleimide triazine resin, a polyamide resin, polycyclohexylene dimethyl terephthalate, polycyclohexane terephthalate, a liquid crystal polymer, polyethylene terephthalate, and polyethylene naphthalate. The resin composite constituting the package member 42 may contain a white pigment having a high optical reflectance for reducing light transmission in the lateral direction of the recess and enhancing the reflection on lateral surfaces of the recess. The resin composite constituting the package member 42 may contain, in addition to the white pigment, a filler, a diffusing agent, and a reflective substance. Examples of a material of the white pigment, the filler, the diffusing agent, or the reflective substance include silicon oxide, titanium oxide, zinc oxide, aluminum oxide, zirconium oxide, calcium oxide, calcium silicate, potassium titanate, and glass particles.

Conductive Member

The plurality of conductive members 20 and 30 contains silver. For a base material of the plurality of conductive members 20 and 30, a plate-shaped member made of at least one metal selected from copper, aluminum, gold, silver, tungsten, iron, and nickel, or an alloy, such as an iron-nickel alloy and phosphor bronze.

For efficiently extracting light from the light emitting element 10, a surface of each of the plurality of conductive members 20 and 30 may be made of silver, aluminum, gold, an alloy of two or more of these, or a metal film made of silver may be formed on a surface of each of the plurality of conductive members 20 and 30. On the surface of each the plurality of conductive members 20 and 30, at least one metal selected from copper including silver, aluminum, gold, tungsten, iron, and nickel, an alloy, such as an iron-nickel alloy and phosphor bronze, or silver may be present. The conductive member preferably includes a film containing silver on a surface of the conductive member in consideration of the reflectance, for enhancing the light extraction efficiency. The conductive member more preferably contains silver or a silver alloy in at least a part of the surface of the conductive member. The film formed on a surface of the conductive member may be a single-layer film or a multi-layer film. The film formed on a surface of the conductive member is preferably formed by a plating treatment.

Light Emitting Element

The light emitting element 10 is used as an excitation light source of the light emitting device 100. The light emitting element 10 has a peak emission wavelength of 320 nm or more. With the peak wavelength of the light emitted from the light emitting element 10 in the ultraviolet region or the visible region, which is 320 nm or more, the reflectance of silver contained in the conductive member is high, and the light extraction efficiency of the light emitting device 100 can be improved. The peak wavelength of the light emitted from the light emitting element 10 is preferably in a range of 320 nm or more and 550 nm or less, more preferably in a range of 350 nm or more and 500 nm or less, further preferably in a range of 400 nm or more and 490 nm or less, still further preferably in a range of 420 nm or more and 475 nm or less, and particularly preferably in a range of 450 nm or more and 475 nm or less. The full width at half maximum of the light emission spectrum of the light emitting element 10 may be, for example, 30 nm or less, 25 nm or less, or 20 nm or less. The full width at half maximum (FWHM) herein refers to the full width at half maximum of the light emission peak, which is the wavelength width of the light emission peak at 50% of the maximum intensity of the light emission peak of each in the light emission spectra. The light emitting element 10 is preferably, for example, a semiconductor light emitting element using a nitride semiconductor ($In_xAl_YGa_{1-X-Y}N$, $0 \leq X$, $0 \leq Y$, $X+Y \leq 1$). Using a semiconductor light emitting element as the light emitting element allows for obtaining a stable light emitting device that has a high efficiency, a high linearity to input, and a high resistance to a mechanical impact.

Sealing Member

The sealing member is preferably a cured silicone composite containing the following components (A), (B), (C), and (D):

(A) an organopolysiloxane containing at least two alkenyl groups each bonded to a silicon atom per one molecule;

(B) an organohydrogenpolysiloxane containing at least two hydrogen atoms each bonded to a silicon atom per one molecule;

(C) a hydrosilylation catalyst; and (D) a zinc silanolate represented by the following formula (1):

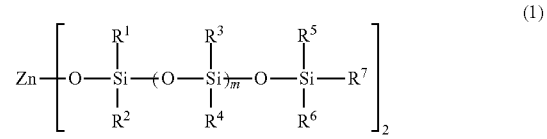

(1)

In the formula (1), $R^1$ to $R^7$ each independently represent a linear, branched, or cyclic monovalent hydrocarbon group having 1 to 10 carbon atoms, which may be substituted by a fluorine atom, or each independently represent a hydroxy group or an alkoxy group; and m represents an integer of 1 or greater.

Component (A)

The component (A) in the silicone composite is an organopolysiloxane containing at least two alkenyl groups each bonded to a silicon atom per one molecule. The component (A) in the silicone composite is a component that constitutes the base material (base polymer) of the composite, and per one molecule thereof, has at least two alkenyl groups each bonded to a silicon atom, preferably has 2 to 20 alkenyl groups each bonded to a silicon atom, and more preferably has 2 to 10 alkenyl groups each bonded to a silicon atom.

The component (A) may be a polysiloxane having one vinyl group and/or one hydrosilyl group per one molecule in view of the low viscosity of the composite.

The alkenyl group in the organopolysiloxane as the component (A) may be bonded to the silicon atom through an organic group. Any appropriate organic group may be employed, and the organic group may have a hetero atom, such as an oxygen atom, a nitrogen atom, and a sulfur atom.

Examples of the alkenyl group include an unsaturated hydrocarbon group having 2 to 8 carbon atoms, such as a vinyl group, an allyl group, a butenyl group, a pentenyl group, a hexenyl group, and a heptenyl group; and a (meth)acryloyl group. Among these, the alkenyl group is preferably a vinyl group or a (meth)acryloyl group, and more preferably a vinyl group, in view of high curability. The organopolysiloxane as the component (A) that has a vinyl group as the alkenyl group has higher curability.

The expression "(meth)acryloyl group" as used herein refers to an acryloyl group and/or a methacryloyl group.

Examples of the bonding position of the alkenyl group include the end of the molecular chain of the polysiloxane and/or the side chain of the molecular chain. The alkenyl group may be bonded to either end or both ends of the molecular chain of the polysiloxane.

In the component (A), examples of the organic group bonded to the silicon atom other than the alkenyl group include an alkyl group, such as a methyl group, an ethyl group, a propyl group, a butyl group, a pentyl group, a hexyl group, and a heptyl group; an aryl group, such as a phenyl group, a tolyl group, a xylyl group, and a naphthyl group; an aralkyl group, such as a benzyl group and an phenethyl group; a halogenated alkyl group, such as a chloromethyl group, a 3-chloropropyl group, and a 3,3,3-trifluoropropyl group; and a cycloalkyl group, such as a cyclopentyl group and a cyclohexyl group. The polysiloxane as the component (A) may have a hydrosilyl group.

Among these, the organic group bonded to the silicon atom other than the alkenyl group is preferably a methyl group or a phenyl group in view of having high heat resistance.

Examples of the main chain of the component (A) include an organopolysiloxane. Specific examples the organopolysiloxane include a dimethylpolysiloxane, a methylphenylpolysiloxane, and a diphenylpolysiloxane. Among these, a dimethylpolysiloxane and/or a modified dimethylpolysiloxane have good heat resistance and light resistance, and thus are preferable. The expression "light resistance" as used herein refers to light resistance against the light emission from the LED (for example, discoloration and burn unlikely occur). The modified dimethylpolysiloxane used in the component (A) is an organopolysiloxane having an organic group other than a methyl group introduced to the side chain or the end. Examples the modified dimethylpolysiloxane include an epoxy-modified dimethylpolysiloxane, an alicyclic epoxy-modified dimethylpolysiloxane, and a polyether-modified dimethylpolysiloxane.

The component (A) may have any appropriate molecular structure. Examples the molecular structure of the component (A) include a linear form, a linear form that partially has a branch, a cyclic form, a branched form, and a three-dimensional network form. Preferred examples of the molecular structure of the component (A) include a linear form. Preferred examples of the molecular structure of the component (A) further include the main chain which contains repetition of a diorganosiloxane units. In the case where a vinyl group-containing polysiloxane and/or a hydroxy group-containing polysiloxane are used as the component (A), the component (A) may have an alkylene group and/or a phenylene skeleton in the structure.

The molecular end of the component (A) may be terminated with a silanol group (i.e., a hydroxy group bonded to a silicon atom) or an alkoxysilyl group, or may be blocked with a triorganosiloxy group, such as a trimethylsiloxy group, or a vinyl group.

Examples of the component (A) include an organopolysiloxane represented by the following formula (I):

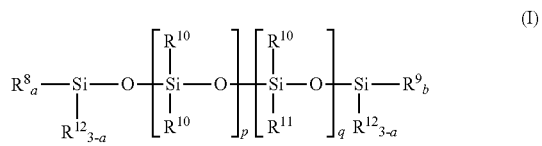

(I)

In the formula (I), $R^8$, $R^9$, and $R^{11}$ each independently represent an alkenyl group; $R^{12}$ each independently represent a monovalent hydrocarbon group other than an alkenyl group, a hydroxy group, or an alkoxy group; $R^{10}$ each independently represent an organic group; a+b+q is 2 or more; a and b each represent an integer of 0 to 3; and p and q each represent an integer of 0 or more.

In the case where the polysiloxane is a polysiloxane that has an alkenyl group as an unsaturated hydrocarbon group, higher curability can be obtained.

Examples of the polysiloxane that has an alkenyl group as an unsaturated hydrocarbon group include an organosiloxane copolymer containing a siloxane unit represented by the formula: $(R^8)_3SiO_{1/2}$, a siloxane unit represented by the formula: $(R^8)_2R^9SiO_{1/2}$, a siloxane unit represented by the formula: $(R^8)_2SiO_{2/2}$, and a siloxane unit represented by the formula: $SiO_{4/2}$; an organosiloxane copolymer containing a siloxane unit represented by the formula: $(R^8)_3SiO_{1/2}$, a siloxane unit represented by the formula: $(R^8)_2R^9SiO_{1/2}$, and a siloxane unit represented by the formula: $SiO_{4/2}$; an organosiloxane copolymer containing a siloxane unit represented by the formula: $(R^8)_2R^9SiO_{1/2}$, a siloxane unit represented by the formula: $(R^8)_2SiO_{2/2}$, and a siloxane unit represented by the formula: $SiO_{4/2}$; and an organosiloxane copolymer containing a siloxane unit represented by the formula: $(R^8)_2R^9SiO_{1/2}$, and a siloxane unit represented by the formula: $R^8SiO_{3/2}$ or a siloxane unit represented by the formula: $R^9SiO_{3/2}$.

In the case where the polysiloxane is a polysiloxane which has an unsaturated hydrocarbon group as the alkenyl group, the polysiloxane may have an alkylene group and/or a phenylene skeleton in the structure.

In the formula (I), $R^{12}$ represents a monovalent hydrocarbon group other than an alkenyl group.

Examples of the monovalent hydrocarbon group other than an alkenyl group include an alkyl group, such as a methyl group, an ethyl group, a propyl group, a butyl group, a pentyl group, a hexyl group, and a heptyl group; an aryl group, such as a phenyl group, a tolyl group, a xylyl group, and a naphthyl group; an aralkyl group, such as a benzyl group and a phenethyl group; and a halogenated alkyl group, such as a chloromethyl group, a 3-chloropropyl group, and a 3,3,3-trifluoopropyl group.

In the formula (I), $R^9$ represents an alkenyl group. Examples of the alkenyl group include a vinyl group, an allyl group, a butenyl group, a pentenyl group, a hexenyl group, and a heptenyl group.

In the case where the component (A) is a polysiloxane which has a (meth)acryloyl group as the alkenyl group, further higher curability can be obtained.

In the case where the component (A) is a polysiloxane which has a (meth)acryloyl group, examples include a compound represented by the following average compositional formula (II):

$$R^{13}{}_c R^{14}{}_d SiO_{(1-c-d)/2} \qquad (II)$$

In the formula (II), $R^{13}$ represents a hydrogen atom, a hydroxy group, an alkyl group having 1 to 10 carbon atoms, or an aryl group; $R^{14}$ represents a (meth)acryloxyalkyl group represented by $CH_2=CR^{16}-CO-O-(CH_2)_j-$ (wherein in $CH_2=CR^{16}-CO-O-(CH_2)_j-$, $R^{16}$ represents a hydrogen atom or a methyl group; and j represents an integer of 2 to 6, and preferably 2, 3, or 4); c represents a number which preferably satisfies $0.8 \leq c \leq 2.4$, and more preferably $1 \leq c \leq 1.8$; and d represents a number which preferably satisfies $0.1 \leq d \leq 1.2$, more preferably $0.2 \leq d \leq 1$, and further preferably $0.4 \leq d \leq 1$; and a sum of c and d (c+d) is preferably a number which satisfies $2 \leq c+d \leq 2.5$, and more preferably $2 \leq c+d \leq 2.2$.

In the formula (II), examples of the alkyl group and the aryl group represented by $R^{13}$ include an alkyl group, such as a methyl group, an ethyl group, a propyl group, a butyl group, a pentyl group, a hexyl group, and a heptyl group; and an aryl group, such as a phenyl group, a tolyl group, a xylyl group, and a napthyl group. Among these, a methyl group, an ethyl group, a propyl group, and a phenyl group are preferred, and a methyl group is particularly preferred.

The molecular weight (weight average molecular weight) of the component (A) is preferably in a range of 500 to 100,000, more preferably 1,000 to 100,000, and further preferably 5,000 to 50,000, which allows for having higher curability, and high toughness, stretchability, and workability. In the description herein, the weight average molecular weight is a polystyrene conversion value by GPC (gel permeation column chromatography).

The viscosity at 23° C. of the component (A) is preferably in a range of 5 to 10,000 mPa·s, and more preferably in a range of 10 to 1,000 mPa·s, since the resulting silicone resin may have good physical characteristics, and the silicone composite may have good handling workability. The viscosity herein is measured with an E-type viscometer under a condition of 23° C.

The component (A) may be used solely or as a combination of two or more kinds. The component (A) may be produced in any appropriate manner, and may be produced, for example, using a known method.

Component (B)

The component (B) in the silicone composite is an organohydrogenpolysiloxane containing at least two hydrogen atoms each bonded to a silicon atom per one molecule. The component (B) in the silicone composite is a polysiloxane crosslinking agent for the silicone composite. The component (B) in the silicone composite may be any appropriate component, as long as it is an organohydrogenpolysiloxane which contains at least two hydrogen groups each bonded to a silicon atom (i.e., SiH groups) per one molecule, and has a polysiloxane structure as the main chain.

The component (B) preferably has 2 to approximately 300, and more preferably 3 or more (for example, 3 to approximately 150) hydrogen groups each bonded to a silicon atom per one molecule. Examples of the molecular structure of the component (B) include a linear form, a branched form, a cyclic form, and a three-dimensional network form.

In the component (B), examples of the bonding position of the hydrogen group bonded to a silicon atom include the end of the molecular chain of the polysiloxane and/or the side chain of the molecular chain. The hydrogen group bonded to a silicon atom may be bonded to any one of the ends of the molecular chain of the polysiloxane or both of the ends.

Examples of the component (B) include an organohydrogenpolysiloxane represented by the following average compositional formula (III):

$$H_e R^{15}{}_f SiO_{(4-e-f)/2} \qquad (III)$$

In the formula (III), $R^{15}$ each independently represent an unsubstituted or substituted monovalent hydrocarbon group which does not contain an aliphatic unsaturated bond; and e and f represent numbers which satisfy $0<e<2$, $0.8 \leq f \leq 2$, and $0.8<e+f \leq 3$, and preferably numbers which satisfy $0.05 \leq e \leq 1$, $0.9 \leq f \leq 2$, and $1.0 \leq e+f \leq 2.7$. The number of silicon atoms per one molecule may be in a range of 2 to 300, and preferably 3 to 200.

In the formula (III), examples of the unsubstituted or substituted monovalent hydrocarbon group which does not contain an aliphatic unsaturated bond represented by $R^{15}$ include an alkyl group, such as a methyl group, an ethyl group, a propyl group, a butyl group, a pentyl group, a hexyl group, and a heptyl group; an aryl group, such as a phenyl group, a tolyl group, a xylyl group, and a naphthyl group; an aralkyl group, such as a benzyl group and a phenethyl group; and a halogenated alkyl group, such as a chloromethyl group, a 3-chloropropyl group, and a 3,3,3-trifluoropropyl group.

Among these, a lower alkyl group having 1 to 3 carbon atoms, such as a methyl group, a phenyl group, and a 3,3,3-trifluoropropyl group are preferred in view of good heat resistance and light resistance.

Examples of the component (B) include a methylhydrogenpolysiloxane having both molecular chain ends blocked with trimethylsiloxy groups, a dimethylsiloxane-methylhydrogensiloxane copolymer having both molecular chain ends blocked with trimethylsiloxy groups, a methylhydrogenpolysiloxane having both molecular chain ends blocked with silanol groups, a dimethylsiloxane-methylhydrogensiloxane copolymer having both molecular chain ends blocked with silanol groups, a dimethylpolysiloxane having both molecular chain ends blocked with dimethylhydrogensiloxy groups, a methylhydrogenpolysiloxane having both molecular chain ends blocked with dimethylhydrogensiloxy groups, and a dimethylsiloxane-methylhydrogensiloxane copolymer having both molecular chain ends blocked with dimethylhydrogensiloxy groups; and a silicone resin formed of a $(R^{15})_2 HSiO_{1/2}$ unit and a $SiO_{4/2}$ unit, which may optionally contain a $(R^{15})_3 SiO_{1/2}$ unit, a $(R^{15})_2 SiO_{2/2}$ unit, a $R^{15} HSiO_{2/2}$ unit, a $(H)SiO_{3/2}$ unit, or a $R^{15} SiO_{3/2}$ unit (wherein in the formulae, $R^{15}$ is the same as the unsubstituted or substituted monovalent hydrocarbon group that does not contain an aliphatic unsaturated bond described above), and also include these example compounds, in which the methyl groups are partially or completely replaced by the other alkyl group, such as an ethyl group and a propyl group, a phenyl group, or a hydrosilyl group.

Examples of the component (B) include an organohydrogenpolysiloxane represented by any one of the following formulae (IV) to (VII):

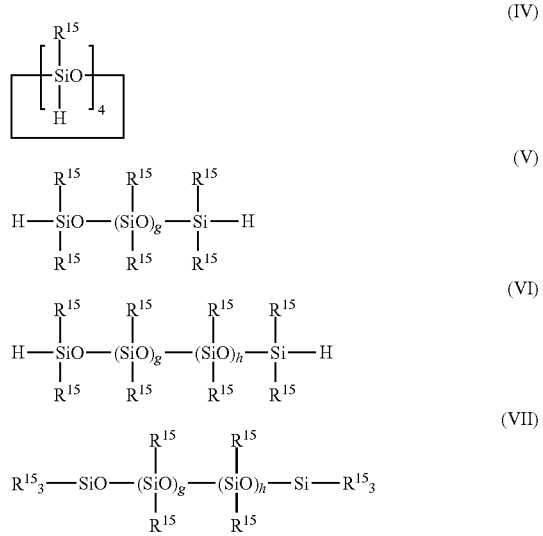

In the formulae (IV) to (VII), $R^{15}$ is the same as the unsubstituted or substituted monovalent hydrocarbon group that does not contain an aliphatic unsaturated bond; g represents an integer of 0 or 1 or more; and h represents an integer of 1 or greater. The component (B) may be used solely or as a combination of two or more kinds thereof.

The component (B) may be produced in any appropriate manner, and may be produced using, for example, a known method. Specifically, for example, the component (B) may be obtained through cohydrolysis of at least one chlorosilane selected from the following general formulae: $R^{15}SiHCl_2$ and $(R^{15})_2SiHCl$ (wherein in the formulae, $R^{15}$ is the same as the unsubstituted or substituted monovalent hydrocarbon group which does not contain an aliphatic unsaturated bond described above), or through cohydrolysis of the chlorosilane in combination with at least one chlorosilane selected from the following general formulae: $(R^{15})_3SiCl$ and $(R^{15})_2SiCl_2$ (wherein in the formulae, $R^{15}$ is the same as the unsubstituted or substituted monovalent hydrocarbon group which does not contain an aliphatic unsaturated bond described above). For the component (B) a compound obtained by equilibrating the polysiloxane obtained through cohydrolysis may be used.

The component (B) is preferably used in such an amount that allows an amount of the hydrogen atom bonded to a silicon atom (i.e., the SiH group) of the component (B) per 1 mol of the alkenyl group of the component (A) to be 0.1 to 5 mol, more preferably 0.5 to 2.5 mol, and further preferably 1.0 to 2.0 mol, in view of good rubber properties (such as toughness and stretchability) after curing.

In the case where the amount of the SiH group is 0.1 mol or more, curing can be sufficiently performed to provide a rubber cured product (silicone resin) having strength.

In the case where the amount of the SiH group is 5 mol or less, the cured product can be prevented from becoming brittle to provide a rubber cured product having strength.

The component (A) and the component (B) may be used in the form of a mixture of the component (A) and the component (B).

Component (C)

The component (C) in the silicone composite is a hydrosilylation catalyst (polysiloxane catalyst). The component (C) in the silicone composite is a polysiloxane crosslinking agent for the silicone composite. The component (C) in the silicone composite is a catalyst for facilitating the addition reaction of the alkenyl group of the component (A) and the hydrogen atom bonded to a silicon atom (i.e., the SiH group) of the component (B). The silicone composite has higher curability due to the component (C) contained.

The component (C) may be any appropriate component. Examples the component (C) include known hydrosilylation catalysts. Specific examples of the component (C) contained in the silicone composite include a platinum group metal catalyst, for example, an elemental substance of a platinum group metal, such as platinum (including platinum black), rhodium, and palladium; a platinum chloride, a chloroplatinic acid, and a chloroplatinate salt, such as $H_2PtCl_4.nH_2O$, $H_2PtCl_6.nH_2O$, $NaHPtCl_6.nH_2O$, $KHPtCl_6.nH_2O$, $Na_2PtCl_6.nH_2O$, $K_2PtCl_4.nH_2O$, $PtCl_4.nH_2O$, $PtCl_2$, and $Na_2HPtCl_4.nH_2O$ (wherein in the formulae, n represents an integer of 0 to 6, and preferably 0 or 6); an alcohol modified chloroplatinic acid (see U.S. Pat. No. 3,220,972); a complex of a chloroplatinic acid and an olefin (see U.S. Pat. Nos. 3,159,601, 3,159,662, and 3,775,452); a catalyst containing a platinum group metal such as platinum black, or palladium, supported on a carrier, such as alumina, silica, and carbon; a rhodium-olefin complex; chlorotris(triphenylphosphine)rhodium (Wilkinson catalyst); and a complex of a platinum chloride, a chloroplatinic acid, or a chloroplatinate salt, and a vinyl group-containing siloxane, particularly a vinyl group-containing cyclic siloxane.

The component (C) may be used in a range of a catalytic amount. The amount thereof may be in a range of 0.1 to 500 ppm (and preferably 10 to 100 ppm) in terms of mass of the platinum group metal based on the total amount of the component (A) and the component (B), in view of the exhibiting high curability.

Component (D)

In the silicone composite, the zinc silanolate represented by the following formula (1) as the component (D) functions as a compound that improves the sulfurization resistance of the light emitting device. In the case where the silicone composite contains the zinc silanolate represented by the following formula (1) as the component (D), the zinc silanolate or a decomposition product of the zinc silanolate exists in the sealing member made of the cured silicone composite, and sulfides in air penetrating through the sealing member are bonded through reaction to the zinc silanolate or a decomposition product of the zinc silanolate, which has higher ionization tendency and reactivity than silver contained in the conductive member, which allows for reducing corrosion of silver contained in the conductive member. Accordingly, the sulfurization resistance of the light emitting device can be improved, and the reflectance of the conductive member can be maintained to increase the lumen maintenance. The zinc silanolate as the component (D) has a siloxane chain as the main chain, and has a good compatibility with the component (A) and the component (B), enabling the formation of the sealing member with high light transmittance. The zinc silanolate as the component (D) is preferably not colored, for preventing the light transmittance of the sealing member from being impaired. For example, the transmittance of the sealing member at 450 nm may be 85% or more, and preferably 90% or more.

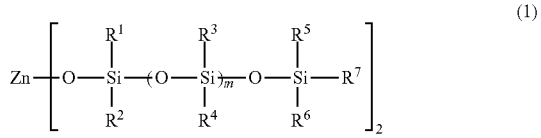

In the formula (1), $R^1$ to $R^7$ each independently represent a linear, branched, or cyclic monovalent hydrocarbon group having 1 to 10 carbon atoms, which may be substituted by a fluorine atom, or each independently represent a hydroxy group or an alkoxy group; and m represents an integer of 1 or greater; and Zinc is divalent zinc.

In the formula (1), $R^1$ to $R^7$ each independently preferably represent a linear or branched alkyl group having 1 to 10 carbon atoms, a trifluoromethyl group, a trifluoroethyl group, a cyclohexyl group, a phenyl group, a tolyl group, a benzyl group, a hydroxy group, or an alkoxy group. Examples of the linear or branched alkyl group each independently having 1 to 10 carbon atoms represented by $R^1$ to $R^7$ include a methyl group, an ethyl group, a propyl group, an isopropyl group, a butyl group, an isobutyl group, a sec-butyl group, a tert-butyl group, a pentyl group, a hexyl group, a heptyl group, an octyl group, a nonyl group, and a decyl group. Examples of the alkoxy group include a methoxy group, an ethoxy group, a propoxy group, an isopropoxy group, a butoxy group, an isobutoxy group, and a tert-butoxy group. In the formula (1), m preferably represents an integer of 1 to 100, more preferably an integer of 1 to 50, further preferably an integer of 2 to 25, still further preferably an integer of 2 to 15, and particularly preferably an integer of 2 to 11.

In the formula (1), at least one group of the two groups represented by $R^1$ and $R^2$ bonded to the silicon atom adjacent to zinc in the siloxane chain is preferably a methyl group or an electron withdrawing group. In the case where in the formula (1), at least one group of the two groups represented by $R^1$ and $R^2$ bonded to the silicon atom of the siloxane unit adjacent to zinc is a methyl group, and a dimethylpolysiloxane is used as the organopolysiloxane (A) in the silicon composite allows for improving compatibility. In the case where in the formula (1), at least one group of the two groups represented by $R^1$ and $R^2$ bonded to the silicon atom of the siloxane unit adjacent to zinc is an electron withdrawing group, the stability of the zinc silanolate represented by the formula (1) is increased to inhibit decomposition of the zinc silanolate, resulting in the increase of the handleability. In the formula (1), $R^1$ preferably represents a methyl group, a trifluoromethyl group, a trifluoroethyl group, a phenyl group, a tolyl group, a benzyl group, a hydroxy group, or an alkoxy group. In the formula (1), $R^2$ preferably represents a methyl group, a trifluoromethyl group, a trifluoroethyl group, a phenyl group, a tolyl group, a benzyl group, a hydroxy group, or an alkoxy group. In the formula (1), $R^1$ and $R^2$ may be the same as or different from each other. In the formula (1), $R^3$ to $R^7$ each preferably represent a methyl group.

In the silicone composite, the component (D) is preferably a zinc silanolate represented by the following formula (2). The zinc silanolate represented by the formula (2) has a good compatibility with the organopolysiloxane as the component (A), and a sealing member having a high light transmittance can be obtained by curing the silicone composite.

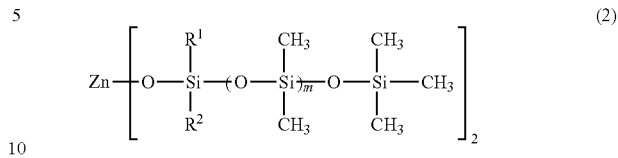

In the formula (2), $R^1$ and $R^2$ may be the same as or different from each other, and each represent a methyl group, a phenyl group, a trifluoromethyl group, a hydroxy group, or an alkoxy group. In the formula (2), m preferably represents an integer of 1 to 50, more preferably an integer of 2 to 25, further preferably an integer of 2 to 15, and particularly preferably an integer of 2 to 11, for providing the silicone composite having a good compatibility and a high light transmittance; and zinc is divalent zinc. In the formula (2), when each of $R^1$ and $R^2$ is the methyl group and a dimethylpolysiloxane is used as the organopolysiloxane (A) in the silicon composite, for example, using a dimethyl silicone resin for the silicon composite allows for further improving compatibility.

In the silicone composite, the zinc silanolate as the component (D) is preferably contained in an amount of in a range of 0.1 part by mass or more and 0.5 part by mass or less per 100 parts by mass in total of the component (A) and the component (B). In the silicone composite, the content of the zinc silanolate as the component (D) is more preferably in a range of 0.12 part by mass or more and 0.45 part by mass or less, and further preferably in a range of 0.13 part by mass or more and 0.40 part by mass or less, per 100 parts by mass in total of the component (A) and the component (B). In the case where in the silicone composite, the content of the component (D) is 0.1 part by mass or more per 100 parts by mass in total of the component (A) and the component (B), the sulfurization resistance can be enhanced, and in the case where the content thereof is 0.5 part by mass or less, the light transmittance of the sealing member made of the cured silicone composite can be increased.

Production Method of Component (D)

The zinc silanolate as the component (D) can be produced through reaction of zinc chloride or a zinc carboxylate salt and an alkali metal salt of a silanol group-containing organopolysiloxane. For example, 2 equivalents of sodium methoxide is added to a linear polysiloxane having silanol groups at both ends, so as to perform deprotonation of the hydroxy group. Subsequently, 1 equivalent of trimethylchlorosilane is reacted to protect one of the ends of the linear polysiloxane with a trimethylsilyl group. The resulting solution is added to a solution of a chloride of zinc dissolved in a mixed solvent of an alcohol and an aromatic hydrocarbon, thereby providing the zinc silanolate represented by the formula (1) or (2).

Examples of the alkali metal salt of a silanol group-containing organopolysiloxane include potassium salt of a diorganopolysiloxane having both molecular chain ends blocked with silanol groups, and a sodium salt of a diorganopolysiloxane having both molecular chain ends blocked with silanol groups. The groups bonded to the silicon atoms of the organopolysiloxane are the groups represented by $R^1$ to $R^7$ in the formula (1) or $R^1$, and $R^2$ in the formula (2), and specifically, each independently preferably are a linear or branched alkyl group having 1 to 10 carbon atoms, a trifluoromethyl group, a trifluoroethyl group, a cyclohexyl group, a phenyl group, a tolyl group, a benzyl group, a hydroxy group, or an alkoxy group. Examples of the linear or branched alkyl group having 1 to 10 carbon atoms include a methyl group, an ethyl group, a propyl group, an isopropyl group, a butyl group, an isobutyl group, a sec-butyl group, a tert-butyl group, a pentyl group, a hexyl group, a heptyl group, an octyl group, a nonyl group, and a decyl group. Examples of the alkoxy group include a methoxy group, an ethoxy group, a propoxy group, an isopropoxy group, a butoxy group, an isobutoxy group, and a tert-butoxy group. At least one group of the two groups bonded to the silicon atom of the siloxane chain adjacent to the silanol group at one of the ends of the silanol group-containing organopolysiloxane is preferably a methyl group or an electron withdrawing group, which is preferably a methyl group, a trifluoromethyl group, a trifluoroethyl group, a phenyl group, a tolyl group, a benzyl group, a hydroxy group, or an alkoxy group. Both the two groups bonded to the silicon atom of the siloxane chain adjacent to the silanol group at one of the ends of the silanol group-containing organopolysiloxane may be methyl groups or electron withdrawing groups, which each are preferably a methyl group, a trifluoromethyl group, a trifluoroethyl group, a phenyl group, a tolyl group, a benzyl group, a hydroxy group, or an alkoxy group.

The reaction of zinc chloride or a zinc carboxylate salt and an alkali metal salt of a silanol group-containing organopolysiloxane is preferably performed in an organic solvent. Examples of the organic solvent include an alcohol, such as methanol, ethanol, isopropanol, butanol, and methoxyisopropanol; an aromatic hydrocarbon, such as toluene and xylene; an aliphatic hydrocarbon, such as hexane and heptane; and petroleum ether. The reaction may be performed at room temperature or under heating.

Fluorescent Material

The silicone composite preferably contains the fluorescent material 70 which absorbs light from the light emitting element 10 and performs wavelength conversion to light having a different wavelength. Examples of the fluorescent material 70 include a YAG (yttrium-aluminum-garnet) fluorescent material activated with Ce (cerium), an LAG (lutetium-aluminum-garnet) fluorescent material activated with Ce, a nitrogen-containing calcium aluminosilicate (CaO—$Al_2O$—$SiO_2$) fluorescent material activated with Eu (europium) and/or Cr (chromium), a silicate (($Sr,Ba)_2SiO_4$) fluorescent material activated with Eu, a β-sialon fluorescent material, and a KSF ($K_2SiF_6$:Mn) fluorescent material. In the composite showing the fluorescent material, the plural elements sectioned by a comma (,) refers to that at least one selected from the plural elements sectioned by a comma (,) is contained, and two or more of the plural elements may be contained in combination. In the composite showing the fluorescent material, the part before the column (:) represents the host crystal, and the part after the column (:) represents the activating element.

The silicone composite may contain, in addition to the components (A) to (D) and the fluorescent material, additional components, such as a filler, a light stabilizer, and a colorant. Examples of the filler include silicon oxide, barium titanate, titanium oxide, and aluminum oxide. The content of the additional components other than the fluorescent material and the components (A) to (D) in the silicone composite is preferably in a range of 0.01 part by mass or more and 20 parts by mass or less per 100 parts by mass of the silicone composite.

Method of Producing Light Emitting Device

One example of a method of producing a light emitting device will be described below.

The plurality of conductive members constituting the bottom portion of the recess of the package member is held with an upper mold, having a recessed part corresponding to the recess of the package member, and a lower mold. a resin composite containing a thermosetting resin or a thermoplastic resin constituting the package member is poured into the space including the recessed part formed with the lower mold and the upper mold holding the conductive members, for example, using a transfer molding method. The resin composite poured to the space formed with the lower mold and the upper mold holding the conductive members is cured, which allows for obtaining the substrate 40 in which the package member 42, having the recess defined by lateral walls, and the plurality of conductive members, constituting the bottom portion of the recess of the package member, are integrally molded.

The upper mold and the lower mold are detached, the light emitting element 10 is mounted on the one conductive member 20 inside the recess of the package member 42, and the light emitting element 10 is electrically connected to the plurality of conductive members 20 and 30 respectively with the wires 60.

The silicone composite containing the components (A) to (D) and the fluorescent material is disposed in the recess of the package member 42 to seal the light emitting element 10 with the silicone composite, and the silicone composite is cured to produce the light emitting device 100 having the sealing member covering the light emitting element 10. For disposing the silicone composite inside the recess of the package member 42, a dropping technique, an injecting technique, an extruding technique, or the like may be employed. The method for disposing the silicone composite inside the recess of the package member 42 is preferably a dropping method since the upper surface of the recess can be used as a guideline for disposing the silicone composite, the silicone composite can be disposed inside the recess while effectively extruding remaining air, and the sealing member made of the cured silicone composite can be produced.

The light emitting device preferably has a lumen maintenance of 80% or more, and more preferably 85% or more. The lumen maintenance is calculated according to the following expression (a), where, in the sulfurization resistance test, the light emitting device is placed in an autoclave with a capacity of 120 cm³ in which 1 g of sodium sulfide nonahydrate is disposed, and is heated at 100° C. for 24 hours; the luminous flux of the light emitting device before the sulfurization resistance test and the luminous flux of the light emitting device after 24 hours from the start of the sulfurization resistance test was measured using an integrating sphere.

$$\text{Lumen maintenance (\%)} = \frac{\text{Luminous flux of light emitting device after sulfurization resistance test}}{\text{Luminance flux of light emitting device before sulfurization resistance test}} \times 100 (a)$$

With the lumen maintenance of the light emitting device of 80% or more, discoloration of silver contained in the conductive member to be black due to the sulfides can be reduced to maintain the high reflectance. Accordingly, the luminous flux of the light extracted from the light emitting device can be retained to a high level, and the sulfurization resistance is improved.

EXAMPLES

The present invention will be described more specifically with reference to Examples. The present invention is not limited to these Examples.

Producing of Zinc Silanolate as Component (D)

2 equivalents of sodium methoxide was added to a linear dimethylpolysiloxane having silanol groups at both ends thereof, so as to perform deprotonation of the hydroxy group. Subsequently, 1 equivalent of trimethylchlorosilane was reacted to protect one of the ends of the linear polysiloxane with a trimethylsilyl group. The resulting solution was dropped to and reacted with a solution of zinc chloride dissolved in a mixed solvent of 1-methoxy-2-propanol and toluene, thereby providing the zinc silanolate represented by the formula (2). In the formula (2), both $R^1$ and $R^2$ were methyl groups, and m was 11.

Example 1

The package member 42 having the recess constituting the side wall and the substrate 40 having the plurality of conductive members 20 and 30 constituting the bottom portion of the recess of the package member as shown in FIG. 1 were prepared. A nitride semiconductor having a light emission peak wavelength of 450 nm as the light emitting element 10 was mounted on the one conductive member 20, and the light emitting element 10 was electrically connected to the conductive members 20 and 30 respectively with the wires 60.

The silicone composite used was a thermosetting dimethylsilicone resin containing the component (A), the component (B), and the component (C) (OE6351, a trade name, produced by Dow Corning Toray Co., Ltd.). The content of the component (C) was as small as 500 ppm (0.05% by mass) or less in the thermosetting dimethylsilicone resin, and thus the amount of the thermosetting dimethylsilicone resin was assumed to be the total amount of the component (A) and the component (B). The zinc silanolate represented by the formula (2) thus produced was used as the component (D), and to 100 parts by mass of the thermosetting dimethylsilicone resin, 0.14 parts by mass of the zinc silanolate as the component (D), 25.92 parts by mass of K2SiF6:Mn, 16.2 parts by mass of (Si,Al)6(O,N)8:Eu, 2.88 parts by mass of CaAlSiN3:Eu, and 36.2 parts by mass of silica (silicon dioxide) as a filler were added to produce a silicone composite. The resulting silicone composite was potted in the recess of the package member 42 by a dropping method, so as to seal the light emitting element 10. The silicone composite was cured at 80° C. for 2 hours and then 150° C. for 3 hours, so as to produce a light emitting device having the light emitting element 10 sealed with the sealing member formed of the silicone composite.

Example 2

A light emitting device was produced in the same manner as in Example 1 except that a silicone composite containing 0.3 part by mass of the zinc silanolate as the component (D) was added to 100 parts by mass of the thermosetting dimethylsilicone resin.

Comparative Example 1

A light emitting device was produced in the same manner as in Example 1 except that a silicone composite that did not contain the zinc silanolate as the component (D) was used.

Measurement of Initial Luminous Flux

The luminous fluxes of the light emitting devices of Examples and Comparative Example were measured with a total luminous flux measuring device using an integrating sphere. The relative luminous fluxes of the light emitting devices of Examples were measured, with the luminous flux of the light emitting device of Comparative Example 1 assumed to be 100%. The results are shown in Table 1.

Sulfurization Resistance Test

The light emitting devices of Examples and Comparative Example were placed in an autoclave a capacity of 120 cm$^3$ in which 1 g of sodium sulfide nonahydrate is disposed and heated at 100° C. for 24 hours to perform a sulfurization resistance test. The luminous flux of each of the light emitting devices after the sulfurization resistance test was measured in the same manner as in the measurement of the initial luminous flux. As shown in the calculation expression (a) shown above, the lumen maintenance was calculated as the product of a value obtained by dividing the luminous flux after the sulfurization resistance test by the luminous flux before the sulfurization resistance test and 100. The results are shown in Table 1.

TABLE 1

| | Initial | | After sulfurization resistance test | |
|---|---|---|---|---|
| | Luminous flux (lm) | Relative luminous flux (%) | Luminous flux after 24 hours (lm) | Lumen maintenance (%) |
| Example 1 | 129.63 | 99.92 | 112.62 | 85.7 |
| Example 2 | 129.78 | 100.05 | 111.35 | 86.0 |
| Comparative Example 1 | 129.73 | 100.0 | 101.23 | 78.1 |

The light emitting devices of Examples 1 and 2, each of which included the sealing member made of the cured silicone resin containing the zinc silanolate as the component (D), had values of relative luminous fluxes that was not largely changed as compared to the light emitting device of the Comparative Example 1. From the result, it was confirmed that the zinc silanolate as the component (D) did not affect the luminous flux of the light emitting device.

The light emitting devices of Examples 1 and 2 each had a lumen maintenance after the sulfurization resistance test of 80% or more, and silver or the silver alloy contained in the conductive member was not discolored with sulfides in air, from which it was confirmed that the sulfurization resistance was improved.

The light emitting device of Comparative Example 1, which included the sealing member made of the cured silicone composite that did not contain the zinc silanolate as the component (D), had a lumen maintenance after the sulfurization resistance test of less than 80%, and thus the sulfurization resistance was not improved.

The light emitting device according to the embodiment of the description can be favorably applied to a surface mount light emitting device, and can be utilized as a light emitting device of automobile use and indoor lighting, a backlight source for a liquid crystal display device, a luminary, a light source device for a projector.

What is claimed is:

1. A light emitting device comprising:
a light emitting element configured to emit light having a peak wavelength of 320 nm or more;
a substrate including a conductive member on which the light emitting element is mounted; and
a sealing member covering the light emitting element, wherein
the conductive member contains silver, and
the sealing member is made of a cured silicone composite containing the following components (A), (B), (C), and (D):
(A) an organopolysiloxane containing at least two alkenyl groups that are each bonded to a silicon atom per one molecule;
(B) an organohydrogenpolysiloxane containing at least two hydrogen atoms that are each bonded to a silicon atom per one molecule;
(C) a hydrosilylation catalyst; and
(D) a zinc silanolate represented by the following formula (1):

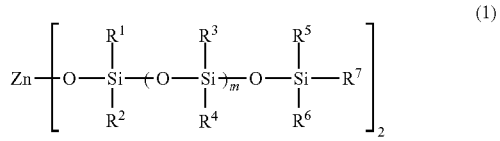

wherein in the formula (1), $R^1$ to $R^7$ each independently represent a linear, branched, or cyclic monovalent hydrocarbon group having 1 to 10 carbon atoms, which may be substituted by a fluorine atom, or each independently represent a hydroxy group or an alkoxy group; and m represents an integer of 1 or greater,
wherein the silicone composite optionally contains, in addition to components (A) to (D), one or more additional components selected from the group comprising a fluorescent material, a filler, a light stabilizer, and a colorant, wherein the additional components, other than the fluorescent material and components (A) to (D), are contained in the silicone composite in a range of 0.01 parts by mass or more and 20 parts by mass or less per 100 parts by mass of the silicone composite, and
wherein the silicone composite has a content of component (D) of 0.1 parts by mass or more and 0.5 parts by mass or less per 100 parts by mass in total of component (A) and component (B).

2. The light emitting device according to claim 1, wherein in the formula (1), $R^1$ to $R^7$ each independently represent a linear or branched alkyl group having 1 to 10 carbon atoms, a trifluoromethyl group, a trifluoroethyl group, a cyclohexyl group, a phenyl group, a tolyl group, a benzyl group, a hydroxy group, or an alkoxy group; and m represents an integer of 2 to 11.

3. The light emitting device according to claim 1, wherein in the formula (1), $R^1$ represents a methyl group, a trifluoromethyl group, a trifluoroethyl group, a phenyl group, a tolyl group, a benzyl group, a hydroxy group, or an alkoxy group.

4. The light emitting device according to claim 1, wherein in the formula (1), $R^2$ represents a methyl group, a trifluoromethyl group, a trifluoroethyl group, a phenyl group, a tolyl group, a benzyl group, a hydroxy group, or an alkoxy group; and $R^3$ to $R^7$ represent methyl groups.

5. The light emitting device according to claim 1, wherein component (A) is a dimethylpolysiloxane and/or a modified dimethylpolysiloxane.

6. The light emitting device according to claim 1, wherein the conductive member contains silver or a silver alloy in at least a part of a surface of the conductive member.

7. The light emitting device according to claim 1, wherein the substrate comprises:
a package member defining a recess defined by a lateral wall, and
the conductive member that constitutes a bottom portion of the recess of the package member.

8. The light emitting device according to claim 1, wherein the light emitting device has a lumen maintenance of 80% or more, the lumen maintenance calculated according to the following expression (a):

$$\text{Lumen maintenance } (\%) = \frac{\text{Luminous flux of light emitting device after sulfurization resistance test}}{\text{Luminance flux of light emitting device before sulfurization resistance test}} \times 100 (a),$$

wherein, in the sulfurization resistance test, the light emitting device is placed in an autoclave with a capacity of 120 cm$^3$ in which 1 g of sodium sulfide nonahydrate is disposed, and the light emitting device is heated at 100° C. for 24 hours; and luminous flux of the light emitting device before the sulfurization resistance test and luminous flux of the light emitting device after the sulfurization resistance test are measured using an integrating sphere.

9. The light emitting device according to claim 8, wherein the silicone composite has a content of component (D) of 0.1 parts by mass or more and 0.5 parts by mass or less per 100 parts by mass in total of component (A) and component (B).

10. The light emitting device according to claim 9, wherein the conductive member contains silver or a silver alloy in at least a part of a surface of the conductive member.

11. The light emitting device according to claim 10, wherein in the formula (1), $R^1$ to $R^7$ each independently represent a linear or branched alkyl group having 1 to 10 carbon atoms, a trifluoromethyl group, a trifluoroethyl group, a cyclohexyl group, a phenyl group, a tolyl group, a benzyl group, a hydroxy group, or an alkoxy group; and m represents an integer of 2 to 11.

12. The light emitting device according to claim 11, wherein the organopolysiloxane as the component (A) is a dimethylpolysiloxane and/or a modified dimethylpolysiloxane.

13. The light emitting device according to claim 12, wherein the substrate comprises:
a package member defining a recess defined by a lateral wall, and
the conductive member that constitutes a bottom portion of the recess of the package member.

14. The light emitting device according to claim 6, wherein in the formula (1), $R^1$ to $R^7$ each independently represent a linear or branched alkyl group having 1 to 10 carbon atoms, a trifluoromethyl group, a trifluoroethyl group, a cyclohexyl group, a phenyl group, a tolyl group, a benzyl group, a hydroxy group, or an alkoxy group; and m represents an integer of 2 to 11.

15. The light emitting device according to claim 14, wherein the conductive member contains silver or a silver alloy in at least a part of a surface of the conductive member.

16. The light emitting device according to claim 15, wherein the substrate comprises:
   a package member defining a recess defined by a lateral wall, and
   the conductive member that constitutes a bottom portion of the recess of the package member.

17. The light emitting device according to claim 8, wherein the conductive member contains silver or a silver alloy in at least a part of a surface of the conductive member.

18. The light emitting device according to claim 17, wherein in the formula (1), $R^1$ to $R^7$ each independently represent a linear or branched alkyl group having 1 to 10 carbon atoms, a trifluoromethyl group, a trifluoroethyl group, a cyclohexyl group, a phenyl group, a tolyl group, a benzyl group, a hydroxy group, or an alkoxy group; and m represents an integer of 2 to 11.

19. The light emitting device according to claim 17, wherein the substrate comprises:
   a package member defining a recess defined by a lateral wall, and
   the conductive member that constitutes a bottom portion of the recess of the package member.

* * * * *